United States Patent [19]

Kondó et al.

[11] 3,983,367

[45] Sept. 28, 1976

[54] SHEET COUNTING MACHINE

[75] Inventors: Takashi Kondó; Motoaki Fukunaga; Hisashi Kitakami, all of Himeji, Japan

[73] Assignee: Glory Kogyo Kabushiki Kaisha, Japan

[22] Filed: Feb. 7, 1975

[21] Appl. No.: 548,080

[52] U.S. Cl. .................... 235/92 SB; 235/92 CT; 235/92 CA; 235/92 R
[51] Int. Cl.² ................................. H03K 21/36
[58] Field of Search ....... 235/92 SB, 92 CT, 92 CA, 235/92 PE, 92 MS, 92, 98 R

[56] References Cited
UNITED STATES PATENTS

| | | | |
|---|---|---|---|
| 3,588,472 | 6/1971 | Glaster et al. .................. | 235/92 SB |
| 3,652,833 | 3/1972 | Shigemori et al. ............. | 235/92 SB |
| 3,682,544 | 8/1972 | Glaser .......................... | 235/92 SB |
| 3,710,936 | 1/1973 | Mizunuma ..................... | 235/92 SB |
| 3,795,796 | 3/1974 | Shigemori et al. ............. | 235/92 SB |

Primary Examiner—Gareth D. Shaw
Assistant Examiner—John P. Vandenburg
Attorney, Agent, or Firm—Wenderoth, Lind & Ponack

[57] ABSTRACT

A sheet counting machine has a sheet counting mechanism which is controlled through a coincidence detecting circuit operating to compare a number of sheets counted with a predetermined number of sheets. The coincidence detecting circuit is provided with a mode changing switch and an inverter connected thereto in the output path to relatively reverse a logical level of an output of the coincidence detecting circuit stop mode. The logical level thus relatively reversed is utilized for controlling the operation of the mechanism through switching elements and relay elements.

1 Claim, 9 Drawing Figures

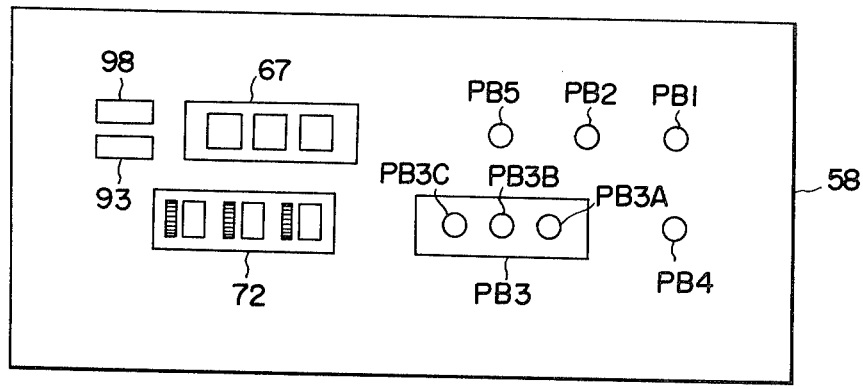
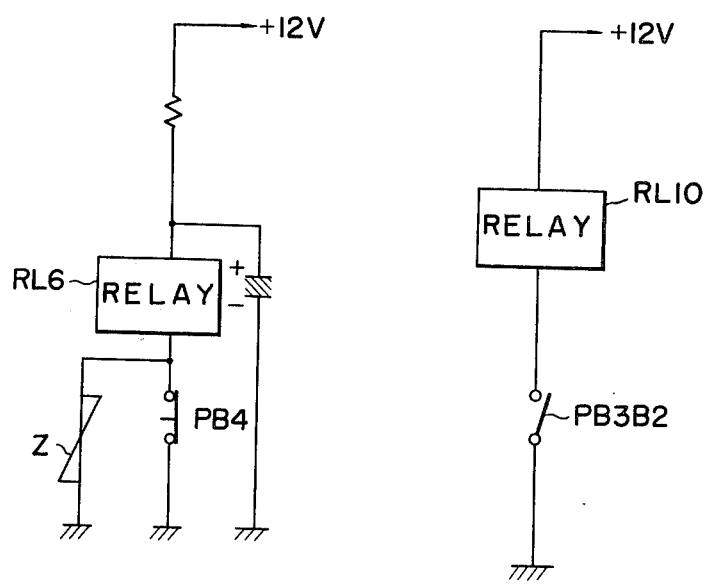

SHEET COUNTING MACHINE

BACKGROUND OF THE INVENTION

This invention relates to sheet counting machines operating to count a number of sheets such as bank notes and cards.

There are two types of sheet counting machines known in the art. One is operated in a sheet counting mode in which a number of sheets to be counted in one sheet counting operation is predetermined and the sheet counting operation is suspended when the number of sheets counted reaches the predetermined number of sheets (hereinafter referred to as "an automatic stop mode"). The other is operated in a sheet counting mode in which all of the sheets inserted are counted, and upon completion of the sheet counting operation an alarm signal is generated if the number of sheets counted is more than or less than a predetermined reference number of sheets, for instance, 100 sheets (hereinafter referred to as "an alarm mode").

The former machine is used for dividing a stack or bundle of many sheets into a plurality of stacks each consisting of a predetermined number of sheets (for instance 100 sheets). The latter machine is used for confirming the number os sheets which are bundled so that the bundle includes a predetermined number of sheets, for instance 100 sheets, (hereinafter referred as "an official number of sheets"). Thus, the conventional sheet counting machine is operated only in the automatic stop mode or only in the alarm mode.

Accordingly, there is a strong demand for the provision of a sheet counting machine which can count a number of sheets in the alarm mode and also in the automatic stop mode, in order to improve efficiency in counting a number of sheets.

SUMMARY OF THE INVENTION

Accordingly, an object of this invention is to provide a novel sheet counting machine which can be operated in both the automatic stop mode and the alarm mode described above.

Another object of the invention is to provide a sheet counting machine having a simple construction.

A further object of the invention is to provide a sheet counting machine which positively carries out a sheet counting operation.

The foregoing objects and other objects as well as the characteristic features of this invention will become more apparent from the following detailed description and the appended claim when read in conjunction with accompanying drawings, in which like parts are designated by like reference numerals or characters.

BRIEF DESCRIPTION OF THE DRAWINGS

In the accompanying drawings:

FIG. 4 is a schematic diagram showing a control board of the sheet counting machine;

FIGS. 5 through 8 are circuit diagrams for the block diagram of FIG. 3; and

DETAILED DESCRIPTION OF THE INVENTION

Figure 1:
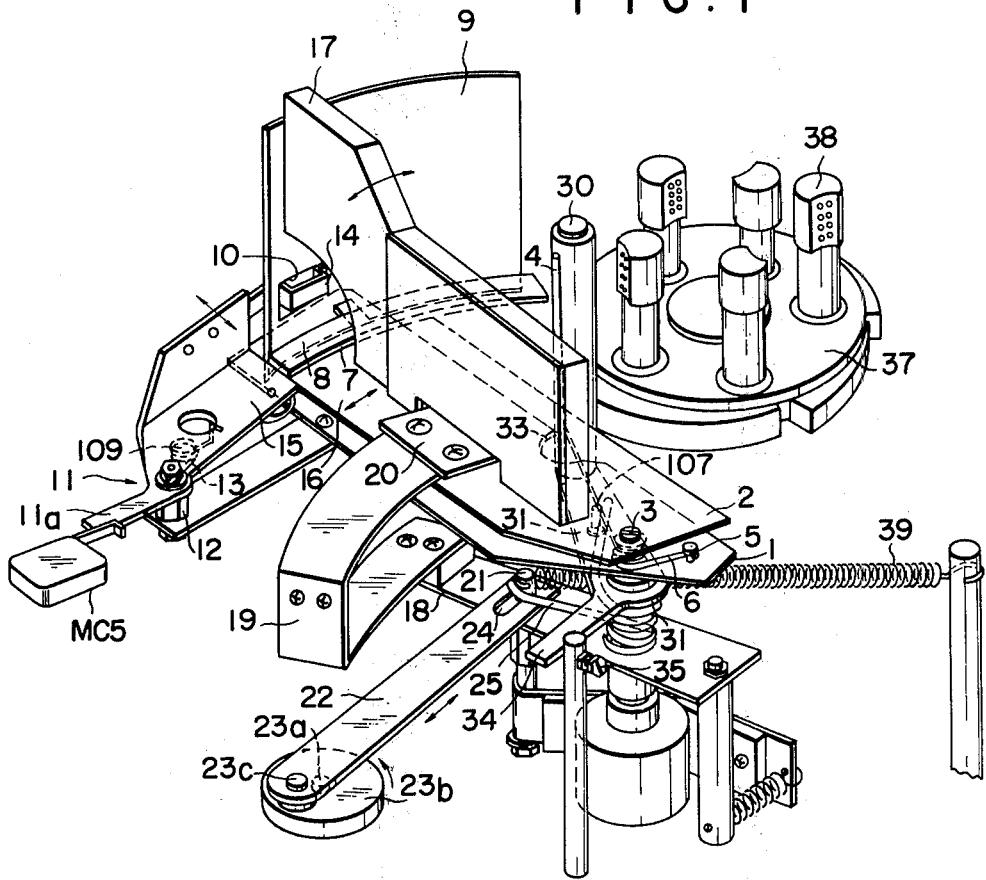
FIG. 1 is a perspective view illustrating a sheet counting mechanism of a sheet counting machine to which this invention can be applied.

As conducive to a full understanding of this invention, the construction of a sheet counting machine to which the invention can be applied will be described with reference to FIG. 1.

The sheet counting machine has a machine frame 1, a sheet laying plate 2 having an arc-shaped end which is rotatably mounted on a shaft 3, a pin 5 provided on the frame 1, and a sheet holding pin 4 embedded in the sheet laying plate 2. These pins 4 and 5 are connected with a spring 6 wound around the shaft 3 so that the plate 2 is turned counterclockwise as viewed from above.

The frame 1 is provided with a sheet sliding plate 8 in such a manner that there is a slight gap 7 between the plate 8 and the arc-shaped end edge of the plate 2, and the upper surface of the plate 8 is flush with that of the plate 2. The outer edge of the sheet sliding plate 8 is fixedly connected to a sheet stop 9 which forms a vertical wall. The left portion of the stop 9 has a slot 10. As is apparent from the above description and FIG. 1, the edge of the sheet sliding plate 8 is arc-shaped, and the wall of the stop 9 is cylindrical.

On the left side of the sheet sliding plate 8, there is a stop 11 rotatably mounted on a shaft 12. This stop is turned clockwise by a spring 13 so as to detain the rotation of the sheet sliding plate 8. Reference numeral 109 designates a part which engages an end of the spring 13. On the upper portion of the stop a release lever 14 is fixedly provided. The end portion of the release lever 14 is bent, and this bent portion extends inward through the slot 10 of the sheet stop 9 so that the right end portion 15 of the stop 11 engages with the left upper end portion 16 of the sheet laying plate 2 so as to detain the counterclockwise turning of the sheet laying plate 2 unless the release lever 14 is pressed outward by sheets.

The machine further comprises a sheet clamping holder 17 under which there is a sheet clamping holder operating member 18 rotatably mounted on the shaft 3. To one end portion of the member 18 one end portion (the lower end portion) of a U-shaped arm 19 is fixedly connected; while the other and portion 20 (the upper end portion) of the arm 19 is fixedly connected to the sheet clamping holder 17. A pin 21 is embedded in the holder operating member 18, and is coupled by a lever 22 having a slot 24 therein to a rotary disk 23b mounted on the rotary shaft 23a of an electric motor $M_1$ (not shown) through an eccentric shaft 23c provided on the rotary disk 23b. The lever 22 is coupled to the pin 21 through the slot 24. The pin 21 is pulled by a spring 25 toward the outer end of the slot 24. Thus, the lever 22 carries out a crank operation, that is, the lever 22 turns the member 18 and accordingly the holder 17 clockwise or counterclockwise according to rotation of the rotary disk 23b.

On the shaft 3 an arm member 31 is rotatably mounted which has a holder detaining pin 30 embedded in one end portion thereof. The spring 25 imparts a torque to the arm member 31 so that the arm member 31 is turned counterclockwise as viewed from above. Reference numeral 107 designates a part to which engages one end of the spring 25. The holder detaining rod 30 is so arranged that it protrudes through a recess 33 provided in the frame 1 so as to regulate the clockwise turning of the holder 17. The arm member 31 has a protruding portion 34 on the other end portion thereof. This protruding portion 34 engages with an adjusting screw 35 so as to regulate the counterclockwise turning of the arm member 31.

Thus, the spring 25 imparts a force to the holder operating member 18 and the arm member 31 so that these elements 18 and 31 approach each other.

Reference numeral 39 designates a spring which operates to turn the holder operating member 18 together with the arm member 31 clockwise.

The stop 11 has a lever 11a at its rear end portion with which insertion detecting switch $M_5$ is engaged.

Reference numeral 38 designates suction heads provided on a rotor 37 of the sheet counting mechanism. When the rotor 37 is revolved by a motor $M_2$ (not shown), these suction heads 38 rotate at a speed corresponding to the revolution of the rotor 37. The sheet counting mechanism thus organized is subjected to drive control by a drive control circuit as follows.

If a stack of sheets is laid on the sheet laying plate 2 in such a manner that the sheets stand against the holder 17, and is then moved toward the sheet stop 9, the stack of sheets will abut the stop thereby pressing the release lever 14 outward. By this operation, the stop 11 is turned around the shaft 12 counterclockwise, and the right lower corner 15 of the stop 11 is disengaged from the sheet laying plate 2. Accordingly, the sheet laying plate 2 is turned counterclockwise by the spring 6, as a result of which the stack of sheets is sandwiched between the holder 17 and the sheet holding pin 4 embedded in the sheet laying plate 2.

Figure 2:
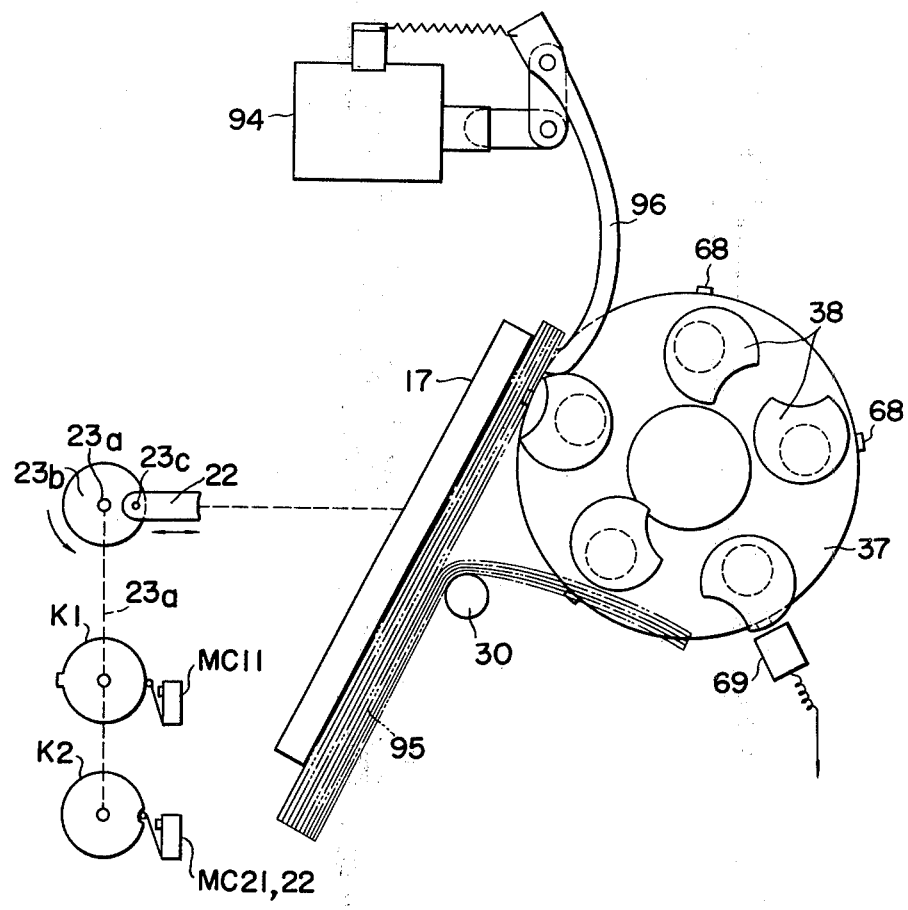
FIG. 2 is an explanatory diagram used for a description of a sheet counting operation carried out by the sheet counting machine.

In the case of the automatic stop mode, when the stop 11 is turned counterclockwise, the switch $MC_5$ is turned on by the lever 11a and the motor $M_1$ is operated. By the operation of the motor $M_1$, the lever coupled to the motor $M_1$ pushes the holder operating member 18, and accordingly the arm member 19 connected to the end portion of the holder operating member 18 turns the holder 17 clockwise. By this movement of the holder 17 the stack of sheets abut against the holder detaining pin 30, and therefore a further movement of the holder 17 is stopped. Under this condition, the end portion of the top sheet of the sheet stack comes to abut against a suction head 38 on the rotor 37. On the other hand, a vacuum pump VPM (now shown) is operated by the operation of the switch $MC_5$. When a vacuum created by the vacuum pump VPM reaches a predetermined value, a vacuum switch is actuated so that the suction heads 38 and the rotor 37 are rotated. As a result, the sheets in a stack are bent back around pin 30 one by one by the suction heads 38 to count the number of sheets as is shown in FIG. 2.

In order to clamp the stack of sheets with the holder 17 and the pin 30, the motor $M_1$ is rotated in the same direction again to produce the crank operation of the lever 22 and thereby to turn the holder 17 counterclockwise.

Figure 3:
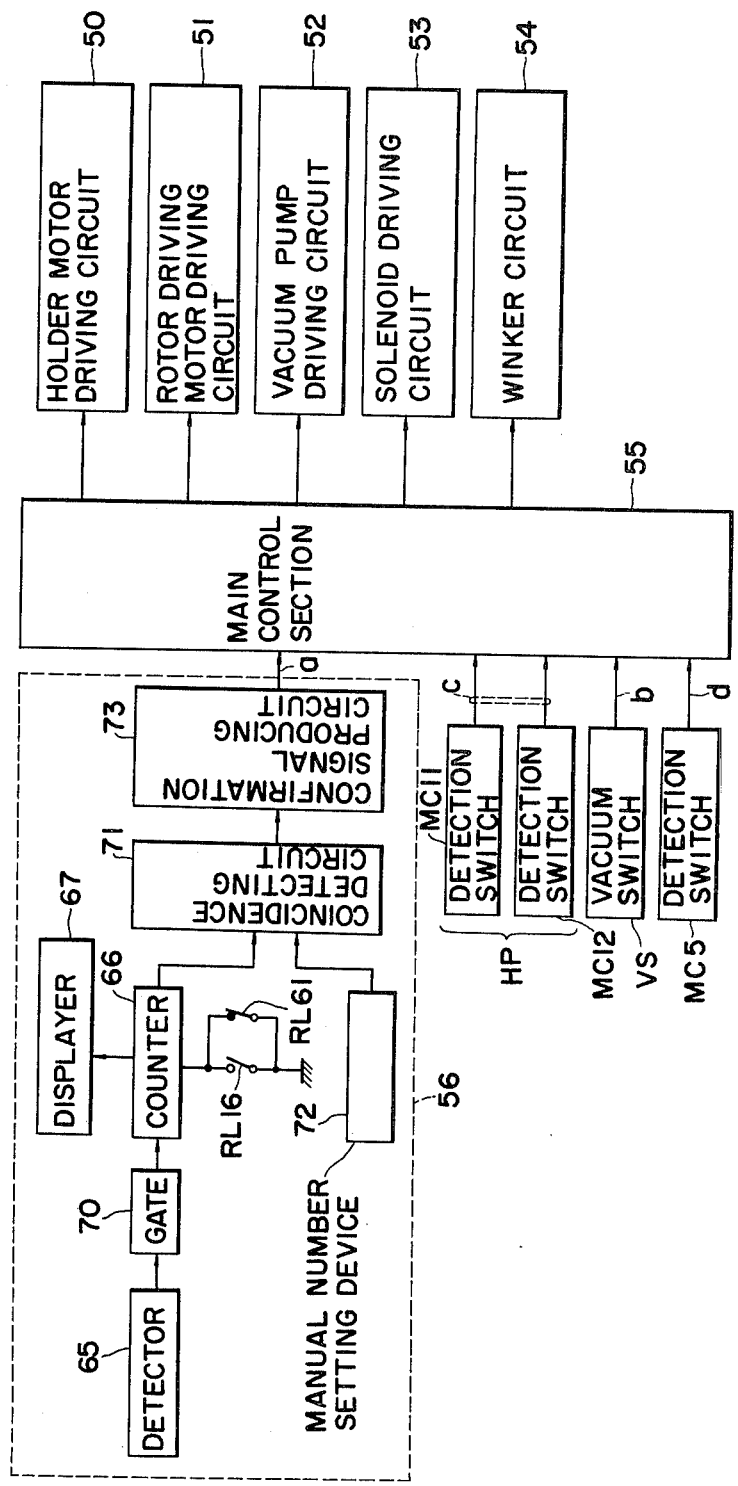
FIG. 3 is a block diagram of an example of the sheet counting machine according to the invention.

The sheet counting machine according to this invention employs a drive control circuit for the above-described sheet counting mechanism as shown in FIG. 3.

The drive control circuit has a main control section 55 which delivers drive condition signals to a holder motor driving circuit 50, a rotor driving motor driving circuit 51, a vacuum pump driving circuit 52, a sheet separating solenoid driving circuit 53, and a winker circuit 54. The main control section 55 receives, as its input condition signals, a count confirmation signal $a$ from a count confirmation circuit 56, a detection signal $b$ from the vacuum switch VS, a detection signal $c$ from a holder position detector HP, and a detection signal $d$ from the detector $MC_5$ operating to detect the insertion of a stack of sheets.

The main control section 55, as is shown in FIG. 4, comprises a mode changing switch $PB_3$, a manual start switch $PB_2$, an automatic start switch $PB_5$, a reset switch $PB_4$, and a power switch $PB_1$, the key levers of which are arranged on a control board 58.

Figure 5:
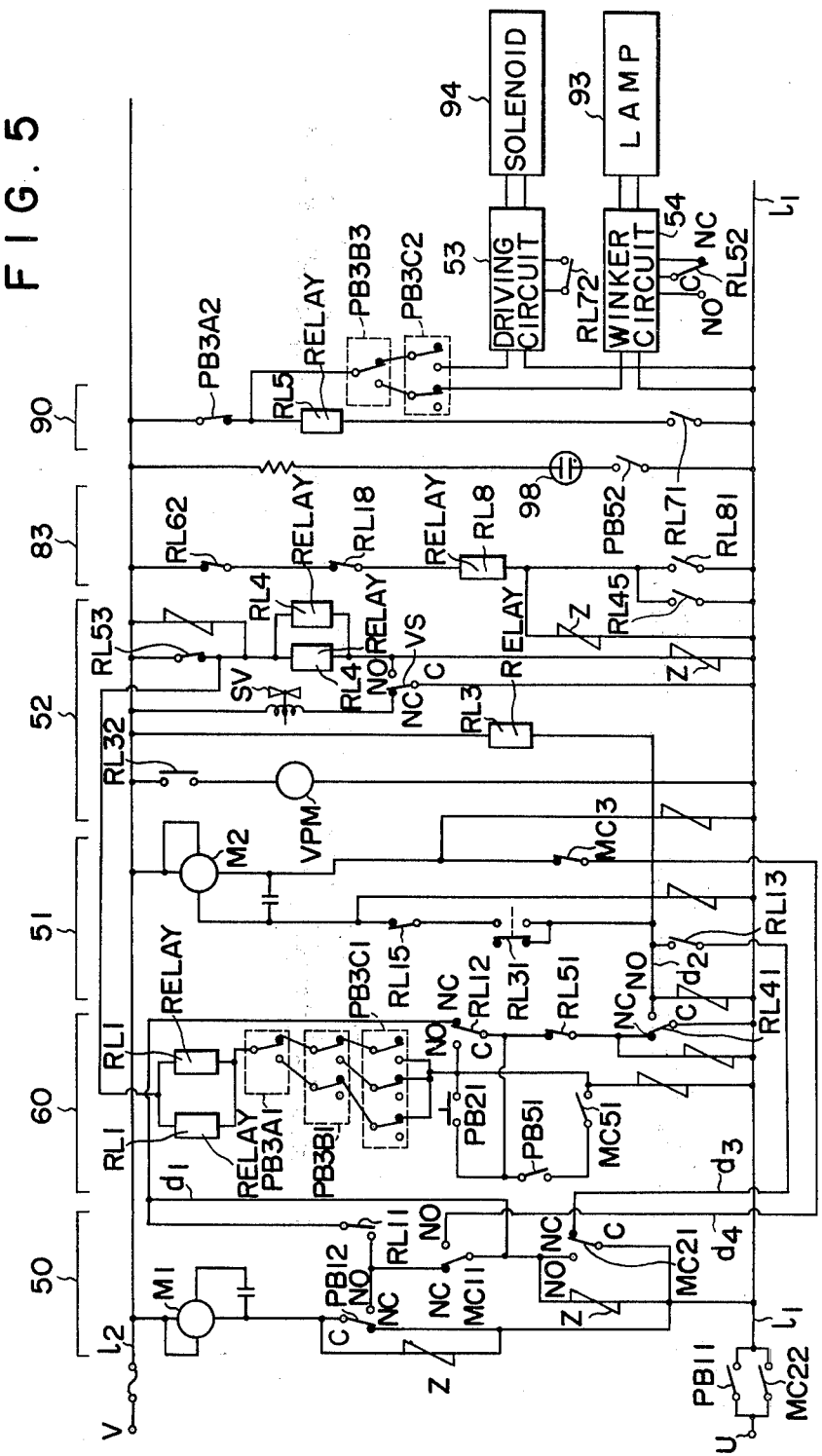

A first normally-open contact means $PB_{11}$ of the power switch $PB_1$, as is shown in FIG. 5, is connected between one power terminal U and a power line $l_1$. The other power terminal V is connected directly to a power line $l_1$. The other power terminal V is connected directly to a power line $l_2$.

The mode changing switch $PB_3$ is composed by three stay-down key switches operatively associated with one another, that is, the switch $PB_3$ is composed by an automatic stop mode selecting switch $PB_{3A}$, an alarm mode selecting switch $PB_{3B}$, and a count mode selecting switch $PB_{3C}$. The automatic start switch $PB_5$ is also a stay-down key switch.

The term "count mode" herein used means a sheet counting operation in which all of the sheets inserted in the sheet counting mechanism are completely counted, and upon completion of the counting operation the operation of the sheet counting mechanism is suspended.

In the example described above, as is shown in FIG. 5 one contact of a selecting switch $PB_{3A1}$, two contacts of a selecting switch $PB_{3B1}$ and three contacts of a selecting switch $PB_{3C1}$ are cascade-connected in the order stated. This cascade connection circuit forms a conduction path only when any one of the switches $PB_{3B1}$, $PB_{3B1}$ and $PB_{3C1}$ is operated. The cascade connection circuit is a part of a start circuit 60 of the main control section 58.

The start circuit 60 has a relay $RL_1$. When a manual start switch $PB_{21}$ is depressed upon operation of manual start switch $PB_2$, the relay $RL_1$ is energized by forming a loop: the power line $l_2$ — a normally closed contact means of a count confirmation relay $RL_5$ described later — the relay $RL_1$ — the selection switches $PB_{3A1}$, $PB_{3B1}$, $PB_{3C1}$ — a contact means $PB_{21}$ of the manual start switch $PB_2$ — a normally closed contact means $RL_{51}$ of the count confirmation relay $RL_5$ — a normally closed contact means $RL_{41}$ of the count operation relay $RL_4$ — the power line $l_1$. On the other hand, when a stack of sheets is inserted into the holder 17 with the automatic start switch $PB_{51}$ turned on, the relay $RL_1$ is energized through a loop: the power line $l_2$ — the normally closed contact means of the count confirmation relay $RL_5$ — the relay $RL_1$ — the selection switches $PB_{3A1}$, $PB_{3B1}$, $PB_{3C1}$ — a sheet insertion detecting switch $MC_{51}$ — a contact means $PB_{51}$ of the automatic start switch $PB_5$ — the power line $l_1$. This energization is self-maintained because the armature of a contact means $RL_{12}$ of the relay $RL_1$ is thrown to the normally open contact NO thereof by the energization of the relay $RL_1$.

An output line $d_1$ is connected between the normally closed contact NC of the contact means $RL_{12}$ of the relay $RL_1$ and the holder motor driving circuit 50. Furthermore, an output line $d_2$ is extended from the normally open contact NO of a contact means $RL_{41}$ of a relay $RL_4$ to the vacuum pump driving circuit 52 and the rotor driving motor driving circuit 51.

The holder motor driving circuit 50 has a holder open position detecting switch $MC_{11}$ the armature of which is thrown to the normally open contact from the normally closed contact when the holder 17 reaches the open position, and a holder closure position detecting switch $MC_{21}$ the armature of which is thrown to the normally closed contact from the normally open contact when the holder 17 reaches the closure position.

The holder motor $M_1$ is energized through a loop: the power line $l_2$ — the normally open contact of a contact means $PB_{12}$ of the power switch $PB_1$ — the normally closed contact of the holder open position detecting switch $MC_{11}$ — the normally open contact of the holder closure position detecting switch $MC_{21}$.

The detecting switches $MC_{11}$ and $MC_{21}$, as is shown in FIG. 2, are arranged to confront cam disks $K_1$ and $K_2$ coupled to the output shaft 23a of the holder motor $M_1$, respectively, so that the armature of the switch $MC_{11}$ is maintained connected to the normally closed contact, but is thrown to the normally open contact only when the holder 17 reaches the open position to cause a projection of the cam disk $K_1$ to actuate the switch $MC_{11}$, and so that the armature of the switch $MC_{21}$ is maintained connected to the normally open contact, but is thrown to the normally closed contact only when the holder 17 reaches the closure position to cause a recess of the cam disk $K_2$ to actuate the switch $MC_{21}$.

Accordingly, the motor $M_1$ is driven through the above-described loop until the holder 17 has reached the open position (or the closure position, and thereafter the motor $M_1$ is stopped when the switch $MC_{11}$ (or $MC_{21}$) is operated to open the loop. This stop-condition of the motor is maintained until the projection (or the recess) of the cam disk $K_1$ (or $K_2$) is disengaged from the switch $MC_{11}$ (or $MC_{21}$) by driving the motor $M_1$ again whereby the loop is formed again.

The output line $d_1$ of the start circuit 60 is connected between the switches $MC_{11}$ and $MC_{21}$ in order to open the holder 17, and a normally open contact means $RL_{11}$ of the relay $RL_1$ of the start circuit 60 is connected in parallel to the switch $MC_{11}$ in order to close the holder 17.

It is assumed that, with respect to the holder motor driving circuit 50, the holder 17 is at the closure position as is shown in FIG. 2, whereby the armatures of the switches $MC_{11}$ and $MC_{21}$ are on the normally closed contacts NC and the machine is stopped.

Under this condition, if the armature of the power switch $PB_{12}$ is thrown to the normally open contact NO, the power switch $PB_{12}$ will be connected to the output line $d_1$ of the start circuit 60 through the normally closed contact of the switch $MC_{11}$, that is, the output line $d_1$ will be connected to the power line $l_1$ through a loop: the contact means $RL_{12}$ of the relay $RL_1$ — the contact means $RL_{51}$ of the relay $RL_5$ — the contact means $RL_{41}$ of the relay $RL_4$. As a result, the motor $M_1$ is driven, and soon thereafter the switch $MC_{21}$ is disengaged from the recess of the cam disk $K_2$, that is, the armature of the switch $MC_{21}$ is thrown to the normally open contact NO, whereby a loop of the switch $MC_{11}$ — the switch $MC_{21}$ is formed, so that the operation of the motor $M_1$ is continued. Thus, the holder 17 continues to move from the closure position until the holder 17 reaches the open position to throw the armature of the switch $MC_{11}$ to the contact NO.

If, when the holder 17 is at the open position, the relay $RL_1$ of the start circuit 60 is energized, the contact means $RL_{11}$ is closed and the switch $MC_{11}$ is bypassed, whereby the motor is driven. Soon, the projection of the cam disk $K_1$ is disengaged from the switch $MC_{11}$ whereby the loop of the switch $MC_{11}$ — the switch $MC_{21}$ is formed again. Through the loop thus formed the motor is driven. Thus, the holder 17 continues to move from the open position unitl the holder 17 reaches the closure position to throw the armature of the switch $MC_{21}$ to the contact NC.

If, when the holder is at the closure position, the relay $RL_1$ is deenergized to throw the armature of the contact means $RL_{12}$ to the contact NC, the holder 17 carries out its opening operation as described above.

In the example, a second holder position detecting switch $MC_{22}$ is connected in parallel to the power switch $PB_{11}$. If, when the holder 17 is at a position other than the closure position, the power switch $PB_{11}$ is opened, the motor $M_1$ is energized through the switch $MC_{22}$ until it is opened. Thus, when the operation of the sheet counting mechanism is suspended, the holder 17 is always returned to the closure position.

The vacuum pump driving circuit 52 comprises a vacuum switch VS provided at the output side of the vacuum pump VPM and which acts as a completion detecting means for detecting when counting is completed. When the vacuum produced by the vacuum pump VPM is sufficient for sucking sheets, the armature of the switch VS is thrown to the normally open contact NO so that the count operation relay $RL_4$ is energized through the normally closed contact means $RL_{53}$ of a relay $RL_5$. As a result, the armature of the contact means $RL_{41}$ in the start circuit is thrown to the normally open contact NO, and a vacuum pump driving relay $RL_3$ connected to the output line $d_2$ of the start circuit 60 is energized. Furthermore, the relay $RL_3$ is energized through an output line $d_3$ connected to the normally closed contact NC of the switch $MC_{21}$ in the holder motor driving circuit 50 and through a normally open contact means $RL_{13}$ of the relay $RL_1$ in the start circuit 60. When the relay $RL_3$ is energized, the a normally open contact means $RL_{32}$ of the relay $RL_3$ is closed and vacuum pump VPM is driven.

If, when the holder 17 is at the closure position, the armature of the switch $MC_{21}$ of the circuit 50 is thrown to the normally closed contact, the relay $RL_3$ is energized through the contact means $RL_{13}$ of the $RL_1$ and the vacuum pump VPM is driven. When the vacuum of the vacuum pump VPM is increased and the armature of the vacuum switch VS is thrown to the normally open contact NO, the relay $RL_4$ is energized. As a result, the armature of the contact means $RL_{41}$ is thrown to the normally open contact NO to energize the relay $RL_3$. At the same time, the self-maintaining of the relay $RL_1$ in the start circuit 60 is released to open the contact means $RL_{12}$.

The rotor driving motor driving circuit 51, similar to the vacuum pump driving relay $RL_3$, is connected to the output line $d_2$ of the start circuit 60, and to the output line $d_3$ of the holder motor driving circuit 50 through the contact means $RL_{13}$ of the relay $RL_1$, and has a series circuit of a normally open contact means $RL_{31}$ of the relay $RL_3$ and a normally closed contact means $RL_{15}$ of the relay $RL_1$. Accordingly, the rotor driving motor $M_2$ is operated by the energization of the relay $RL_3$.

An output line $d_4$ connected to the normally open contact NO of the switch $MC_{11}$ in the holder motor driving circuit 50 is connected to a reverse rotation terminal of the rotor driving motor $M_2$ through a predetermined position detecting switch $MC_3$ provided in association with the output shaft of the motor $M_2$. Therefore, when the holder 17 reaches the open position and the armature of the switch $MC_{11}$ is thrown to the normally open contact, the motor $M_2$ is rotated in the opposite direction until the switch $MC_3$ is opened, whereby the motor $M_2$ is stopped at the predetermined position.

The normally closed contact of the vacuum switch VS is connected to a pressure releasing solenoid valve SV provided in the vicinity of a suction port of the suction heads 38 so that, when the switch VS has detected reduction of the vacuum and the armature of the switch VS has been therefore thrown to the normally closed contact, the valve SV is abruptly opened so that sheets are no longer drawn to the suction heads.

In the sheet counting machine according to this invention, the count confirmation output $a$ of the count confirmation circuit 56 is applied, as a control input, to the drive control circuit described above.

The count confirmation circuit 56, as is shown in FIG. 3, comprises a counter 66 of, for instance, three digits which counts output pulses of a sheet count detector 65. Data of the counter 66 are displayed on a displayer 67 provided on the control board 58 (FIG. 4) and are produced as binary-coded decimal outputs.

The sheet count detector 65, as is shown in FIG. 2, comprises a proximity switch 69 provided adjacent the peripheral surface of the rotor 37. Iron pieces 68 are provided on the peripheral surface of the rotor 37 in correspondence to the positions of the suction heads 38 so that the iron pieces pass across the proximity switch 69 during the rotation of the rotor 37. Accordingly, whenever one iron piece 68 passes across the proximity switch 69, one count pulse is produced by the proximity switch 69.

The count pulses thus obtained are introduced to the counter circuit 66 through an input gate circuit 70 which opens when the relay $RL_4$ (FIG. 5) is energized. The digit outputs of the counter 66 are applied, as count inputs, to a coincidence detecting circuit 71.

The counter 66 is reset by a normally open contact means $RL_{16}$ of the start $RL_1$ when the start relay $RL_1$ is energized for starting the succeeding count operation. In addition, the counter 66 is also reset by a normally closed contact means $RL_{61}$ of a reset relay $RL_6$ (FIG. 6) when the reset switch $PB_4$ is depressed.

The count confirmation circuit 56 has a device 72 which is adapted to manually set a number of sheets to be counted and to produce a binary-coded decimal output for each of the three-digit number of sheets (hereinafter referred to as "a manual number setting device 72"). These binary-coded decimal outputs are applied, as set inputs, to the coincidence detecting circuit 71.

The coincidence detecting circuit 71 operates to compare the digit outputs of the counter 66 with the digit outputs, in the form of the binary-coded decimal outputs, of the manual number setting device 72, respectively, and upon coincidence, produce a coincidence output at a low voltage level (hereinafter referred to as a logical L level when applicable) for every digit. This coincidence output is applied to a confirmation signal producing circuit 73.

Figure 7:
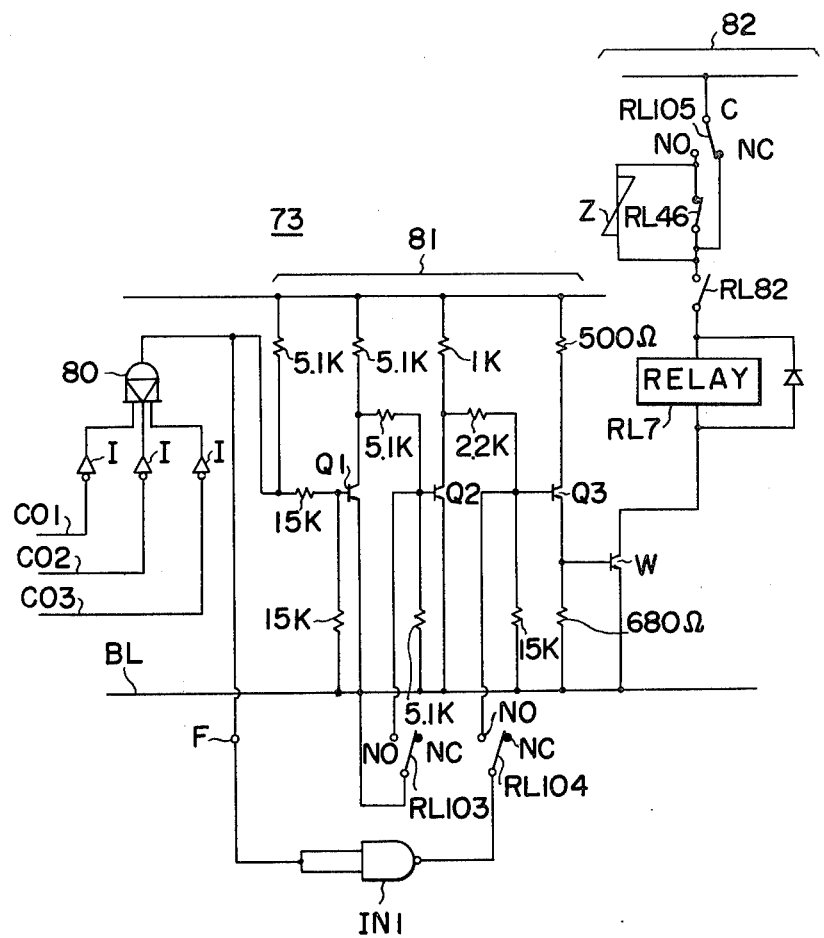

The confirmation signal producing circuit 73, as is shown in FIG. 7, has a diode AND circuit 80 with inverters I. Through the inverters I, the AND circuit 80 receives the coincidence outputs $CO_1$, $CO_2$, and $CO_3$ produced by the coincidence detecting circuit 71 for the respective digits of the number of sheets to be counted, respectively. An output of the diode AND circuit 80 is applied to an output condition circuit 82 through an amplifier circuit 81 composed by cascade-connecting three npn-type transistors $Q_1$, $Q_2$ and $Q_3$.

In the amplifier circuit 81, the base of the transistor $Q_2$ is connected to a low level bus line BL through a normally open contact means $RL_{103}$ of an alarm mode relay $RL_{10}$ shown in FIG. 8, and an output of the diode AND circuit 80 is applied to the base of the transistor $Q_3$ through an inverter $IN_1$ and a normally open contact means $RL_{104}$ of the relay $RL_{10}$.

In the output condition circuit 82, there are connected in series a switching transistor W controlled by the output of the amplifier circuit 81, an output relay $RL_7$, a normally open contact means $RL_{82}$ of an output condition relay $RL_8$ in a confirmation output condition circuit 83 (FIG. 5) of the main control section 55, a normally closed contact means $RL_{46}$ of the count operation relay $RL_4$, and a normally open contact of a contact means $RL_{105}$ of the alarm mode relay $RL_{10}$; and the connection point of the contact means $RL_{82}$ and $RL_{46}$ is connected to the normally closed contact of the contact means $RL_{105}$.

The confirmation output condition relay $RL_8$ is energized through a series circuit of a contact means $R_{45}$ of the relay $RL_4$, a normally closed contact means $RL_{18}$ of the start relay $RL_1$, and a normally closed contact means $RL_{62}$ of the reset relay $RL_6$ when the vacuum of the vacuum pump VPM reaches the predetermined value and the relay $RL_4$ is energized, as a result of which the contact means $RL_{82}$ (FIG. 7) is closed. The energized condition of the relay $RL_8$ is self-maintained through the normally open contact means $Rl_{81}$, but is released by opening the contact means $RL_{81}$ when the reset operation is effected or when the relay $RL_1$ is energized.

The alarm mode relay $RL_{10}$ (FIG. 8) is energized when an alarm mode switch $PB_{3B2}$ is closed, as a result of which the armature of the contact means $RL_{103}$ is thrown to the normally open contact from the normally closed contact.

The operation of the count confirmation circuit 56 will now be described.

When the alarm mode has been selected, that is, the alarm mode switch $PB_{3B2}$ (FIG. 8) has been closed, the contact means $RL_{103}$ and $RL_{104}$ of the relay $RL_{10}$ are closed, i.e. thrown to the NO contact thereof, while the armature of the contact means $RL_{105}$ is switched over to the normally open contact (FIG. 7). Accordingly, the transistor $Q_2$ in the amplifier circuit 81 is in the off-state, and the collector level output at a high level of the transistor $Q_2$ is applied to the base of the transistor $Q_3$.

Under this condition, at least one of the digit outputs of the coincidence detecting circuit 71 is at a high level during a period when the count data of the counter 66 does not coincide with the set data of the manual number setting device 72. Therefore, the output (at a low level) of the diode AND circuit 80 is applied, as a high level input, to the transistor $Q_3$ through the inverter $IN_1$. Accordingly, the transistor $Q_3$ is caused to be on and its collector level is at a high level which maintains the switching transistor W of the output condition circuit 82 conductive. If in this case the sheet counting mechanism is operating, the count operation relay $RL_4$ is in an energized state and its contact means $RL_{46}$ is open. Accordingly, the output relay $RL_7$ is in a non-energized state.

If the sheet counting mechanism completes the counting of all of the sheets in a stack and the count operation relay $RL_4$ is therefore deenergized (with the armature of the vacuum switch VS being thrown to the normally closed contact) although no coincidence is detected by the coincidence detecting mechanism yet, the contact means $RL_{46}$ is closed, as a result of which the output relay $RL_7$ is energized. This will be referred as a first case.

In a second case where the sheet counting operation is completed as soon as the coincidence is detected by the coincidence detecting circuit 71, all of the digit outputs become low in level. As a result, the output of the inverter $IN_1$ becomes low in level, and the transistor $Q_3$ is therefore turned off. Accordingly, the transistor W of the output condition circuit 82 is also made non-conductive, and the output relay $RL_7$ is not energized.

Figure 9:
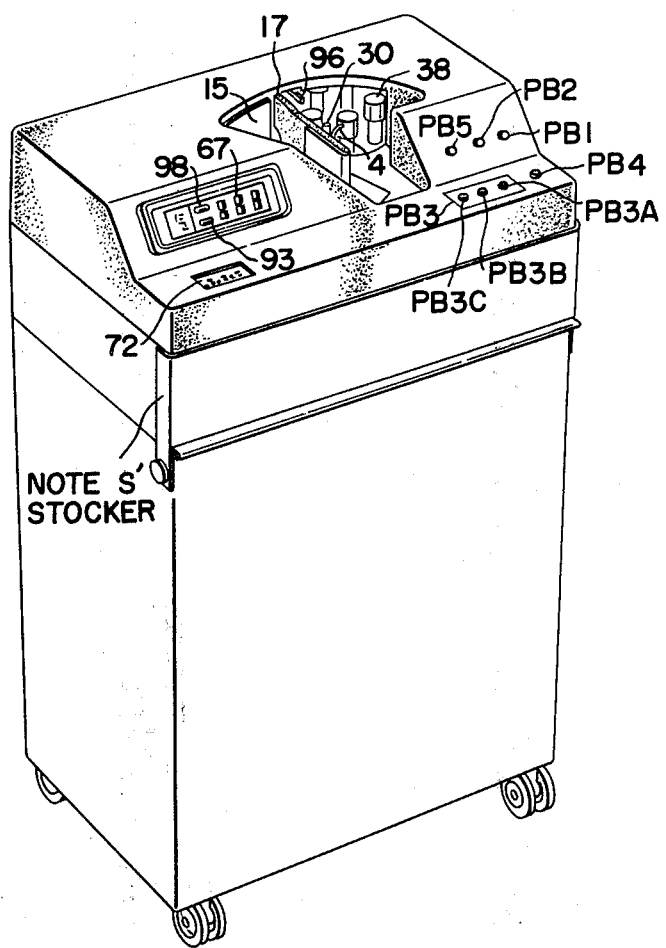
FIG. 9 is a perspective view showing the appearance of the sheet counting machine according to the invention.

In a third case where the sheet counting operation is still continued although the coincidence has been detected by the coincidence detecting circuit 71, when the first detection pulse occurring after the coincidence arrives at the counter 66, all of the digit outputs of the coincidence detecting circuit 71 become high in level (since the counter 66 is overflowed and all the digits have the FIG. 9), as a result of which the relay $RL_7$ is energized upon completion of the sheet counting operation similarly as in the first case described above.

In the case where the alarm mode switch $PB_{3B2}$ (FIG. 8) is open (not depressed), the contact means $RL_{103}$ and $RL_{104}$ of the relay $RL_{10}$ are open, and the armature of the contact means $RL_{105}$ is on the normally closed contact NO.

When the coincidence has not yet been detected by the coincidence detecting circuit 71, the output of the diode AND circuit 80 is at a low level, and therefore the transistors $Q_1$, $Q_2$ and $Q_3$ are off, on, and off, respectively. Therefore, the switching transistor W of the output condition circuit 82 is non-conductive, and the relay $RL_7$ is therefore maintained in a deenergized state. This will be referred to as a first condition.

When after the first condition the coincidence is detected by the coincidence detecting circuit 71, the output of the diode AND circuit 80 becomes high in level, and therefore the switching transistor W is made conductive, and therefore the relay $RL_7$ becomes energized. This will be referred to as a second condition.

When after the second condition the sheet counting operation is further continued by the sheet counting mechanism and the coincidence is not detected by the coincidence detecting circuit 71 because of the overflow of the counter 66, the first condition described above occurs again and the relay $RL_7$ is deenergized.

When the relay $RL_7$ is energized, its output actuates a contact means in a stop condition circuit 90 of the main control circuit 55. The stop condition circuit 90 includes the count confirmation relay $RL_5$ which is energized through a normally open contact means $Rl_{71}$ of the relay $Rl_7$ and a normally closed contact means $PB_{3A2}$ of the count switch $PB_{3A}$. Upon energization of the relay $RL_5$, the contact means $Rl_{51}$ connected to the output line $d_1$ of the start circuit 60 is opened.

The count switch $PB_{3A2}$ of the stop condition circuit 90 is also used in common for driving the winker circuit 54 and the sheet separating solenoid driving circuit 53. More specifically, the winker circuit 54 and the solenoid driving circuit 53 are connected between the power lines $l_1$ and $l_2$ through the count switch $PB_{3A2}$ and a cascade connected circuit of an alarm switch $PB_{3B3}$ and an automatic stop switch $PB_{3C2}$ consisting of two contact means. The winker circuit 54 becomes operative by depressing the alarm switch $PB_{3B3}$ only, while the solenoid driving circuit 53 becomes operative by depressing the automatic stop switch $PB_{3C2}$ only. The cascade-connected circuit is a protection circuit which, when the two switches $PB_{3B3}$ and $PB_{3C2}$ are depressed by mistake, prevents the circuits 54 and 53 from becoming operative.

The winker circuit 54 is provided with a contact means $RL_{52}$ of the count confirmation relay $RL_5$. If, when the alarm switch $PB_{3B3}$ has been depressed, the relay $RL_5$ is not energized, the armature of the contact means $RL_{52}$ is on the normally closed contact NC, whereby an alarm mode selection display lamp 93 is continuously operated. If the relay $RL_5$ is energized, the armature of the contact means $RL_{52}$ is thrown to the normally open contact NO, whereby the lamp 93 starts its winking operation.

The solenoid driving circuit 53 is provided with a normally open contact means $RL_{72}$ of the relay $RL_7$ in the output condition circuit 82 (FIG. 7). If, when the automatic stop switch $PB_{3C2}$ has been depressed, the relay $RL_7$ is energized, a solenoid 94 connected to the solenoid driving circuit 53 is energized, and as is shown in FIG. 2, a sheet separating pawl 96 is operated to separate a stack of sheets 95 from the suction head 38.

Reference character Z indicated in FIGS. 5, 6 and 7 designates arc-suppression circuits connected in parallel to the respective contact means.

In FIGS. 4 and 5, reference numeral 98 designates an automatic start condition selection display lamp which is turned on when a normally open contact means $PB_{52}$ of the automatic start switch $PB_5$ is closed.

When the sheet counting machine thus organized is not operated, the holder 17 (FIGS. 1 and 2) is at the closed position.

In this condition, first operator determines whether or not the machine should be automatically started by using the automatic start switch $PB_5$, and selects one count mode by selectively depressing one of the switches in the mode changing switch $PB_3$.

When the automatic stop mode selecting switch $PB_{3C}$ has been depressed by the operator, he sets a number of sheets to be counted in the automatic stop mode in the manual number setting device 72. When the alarm mode selection switch $PB_{3B}$ has been depressed by the operator, he sets in the manual number setting device 72 a number of sheets which should be included in a stack (for instance 100, where an official bundle of 1,000-yen bank notes has 100 sheets of 1,000-yen notes). When the count mode selecting switch $PB_{3A}$ has been depressed by the operator, he sets 0 for all the digits in the manual number setting device 72. Thereafter, he turns on the power switch $PB_1$.

By turning on the power switch $PB_1$, the holder motor $M_1$ is driven through the loop made up of the contact means $PB_{12}$ of the power switch $PB_1$, the open position detecting switch $MC_{11}$, the output line $d_1$, the contact means $RL_{12}$ of the relay $RL_1$, the contact means $Rl_{51}$ of the relay $RL_5$, and the contact means $RL_{41}$ of the relay Rl$_4$. As a result, the holder 17 is moved to the open position. Now the operator can insert a stack of sheets 95 into the holder 17.

In the case where the automatic start switch PB$_5$ has been depressed, the start relay RL$_1$ is energized immediately when the sheet insertion detecting switch MC$_{51}$ is closed. In the case where the automatic start switch PB$_5$ has not been depressed by the operator, he depresses the manual start switch PB$_2$ to close the contact means Pb$_{21}$, as a result of which the relay Rl$_1$ is energized.

While the start relay Rl$_1$ is self-maintained through its contact means Rl$_{12}$, the motor M$_1$ is driven again through the loop made up of the power switch PB$_{12}$, the contact means RL$_{11}$ of the relay RL$_1$, and the closure position detecting switch MC$_{21}$. As a result, the holder 17 is closed to hold the stack of sheets 95 between the holder 17 and the pin 30, that is, the stack of sheets 95 abuts against the suction head 38.

When the holder 17 is moved to the closed position, the vacuum pump relay RL$_3$ is energized through the loop made up of the detecting switch MC$_{21}$, the output line $d_3$ and the contact means RL$_{13}$ of the relay Rl$_1$, as a result of which the vacuum pump VPM is operated and the rotor driving motor M$_2$ starts.

When the output vacuum of the vacuum pump VPM has reached the predetermined value, the vacuum switch VS is operated to energize the count operation relay RL$_4$. Accordingly, the operations of the vacuum pump VPM and the rotor driving motor M$_2$ are continued. On the other hend, the air releasing solenoid valve Sv is closed by the operation of the vacuum switch VS, as a result of which the predetermined vacuum is applied to the suction heads 38 to count the number of sheets in the stack 95.

Furthermore, the energization of the relay RL$_4$ causes the input gate 70 of the count confirmation circuit 56 (FIG. 3) to open. Through the gate 70 thus opened, count pulses of the detector 65 are applied to the counter 66, which operates to display a numerical value corresponding to the sheet counting operation of the suction heads 38 on the displayer 67.

The response operations of the sheet counting machine in completing the sheet counting operation differ according to the sheet counting modes as follows.

First, the case where the automatic stop mode has been selected will be described. In the output circuit 73 of the count confirmation circuit 56, the contact means RL$_{103}$ and RL$_{104}$ of the alarm mode relay RL$_{10}$ are open, and the armature of the contact means RL$_{105}$ is on the normally closed contact NC. Accordingly, when the contents of the counter 66 coincide with the numerical value set in the manual number setting device 12, the switching transistor W of the output condition circuit 82 is made conductive. On the other hand, the confirmation output condition relay RL$_8$ (FIG. 5) is self-maintained in the energized condition. Therefore, the output relay RL$_7$ is energized immediately upon the transistor W becoming conductive.

As a result, the sheet separating solenoid 94 is energized through the contact means RL$_{72}$ provided in the solenoid driving circuit 53, and the sheet separating pawl 96 (FIG. 2) separates the stack of sheets 95 from the suction head 38. Accordingly, the suction head 38 sucks the air, pressure vacuum pressure therein is abruptly lowered, and the vacuum switch VS becomes inoperative, thereby detecting the completion of counting of sheets. Therefore, the armature of the switch VS is thrown to the normally closed contact NC, the relay RL$_4$ is deenergized, and the armature of the contact means Rl$_{41}$ in the start circuit 60 is thrown to the normally closed contact. As a result, the operations of the vacuum pump VPM and the rotor driving motor M$_2$ are suspended. On the other hand, the count confirmation relay RL$_5$ in the circuit 90 is energized by the energization of the relay Rl$_7$. Thus, the sheet counting operation is completed with the holder 17 kept at the closed position.

In the case when all of the sheets in the stack 95 have been counted before the content of the counter 66 coincides with the numerical data set in the manual number setting device 72, the relay Rl$_7$ is not energized, and therefore the sheet separating pawl 96 is not operated. However, since there is no sheet on the suction head 38 in this case, the suction head 38 sucks air instead of sheets, as a result of which the vacuum therein is abruptly lowered. Accordingly, the relay RL$_4$ is deenergized. On the other hand, the count confirmation relay RL$_5$ is in the deenergized state since the contact means Rl$_{71}$ is open. Therefore, the output line d$_1$ of the start circuit 60 is connected to the power line l$_1$ through the loop made up of the contact means RL$_{12}$ of the relay RL$_1$, the contact means RL$_{51}$ of the relay RL$_5$, and the contact means RL$_{41}$ of the relay RL$_4$, so that the holder motor M$_1$ is driven through the open position detecting switch MC$_{11}$. As a result, the sheet counting operation is ended with the holder 17 kept at the open position.

Second, the case where the alarm mode has been selected will be described. In this case, the contact means RL$_{103}$ and RL$_{104}$ of the alarm mode relay RL$_{10}$ are closed while the armature of the contact means RL$_{105}$ thereof is on the normally open contact NO in the circuit 73 of the count confirmation circuit 56. Therefore, the switching transistor W is rendered non-conductive when the contents of the counter 66 coincide with the numerical data set in the manual number setting device 72, but is rendered conductive when the contents of the counter 66 do not coincide with the numerical data set in the device 72.

During the period the suction heads 38 are counting the sheets 95, the relay RL$_4$ is kept energized to keep the contact means RL$_{46}$ (FIG. 7) open, and therfore the relay RL$_7$ is not energized.

When the suction heads 38 have counted all of the sheets, there is no sheet on the suction head 38. Accordingly, the vacuum in the suction head 38 is lowered and the relay RL$_4$ is deenergized. As a result, similar to the case described above, the operations of the vacuum pump VPM and the rotor driving motor M$_2$ are suspended. Upon deenergization of the relay RL$_4$, the contact means RL$_{46}$ is closed, and therefore the output relay RL$_7$ is energized when the transistor W is conductive (that is, the number of sheets counted is more or less than the set value). Under this condition, the count confirmation relay RL$_5$ in the circuit 90 is energized and the armature of the contact means RL$_{52}$ in the winker circuit 54 is thrown to the normally open contact, as a result of which the display lamp 93 starts its winking operation. On the other hand, since the contact means RL$_{51}$ of the start circuit 60 is opened by the energization of the relay RL$_5$, the output line $d_1$ is not connected to the power line $l_1$. As a result, the sheet counting operation is ended with the holder 17 kept at the closed position.

On the other hand, when the transistor W is non-conductive (that is, the number of sheets counted is equal to the set value), the output relay $RL_7$ is not energized and therefore the display lamp 93 of the winker circuit 54 does not carry out the winking operation. In addition, the contact means $RL_{51}$ in the start circuit 60 is closed to connect the output line $d1$ to the power line $l_1$. As a result, the sheet counting operation is ended with the holder 17 kept at the open position.

In the case where the sheet counting operation in the alarm mode is repeatedly carried out with respect to a plurality of stacks of sheets, the contents of the counter 66 sometimes coincide with the contents set in the manual number setting device 72 during the period time of from the time instant when the start relay $RL_1$ of the start circuit 60 is energized to the time instant when the previous count contents of the counter 66 is reset. In this case, the winker circuit 54 is sometimes operated. In order to prevent this, the normally open contact means $RL_{82}$ of the confirmation output condition relay $RL_8$ is provided in the confirmation signal producing circuit 73.

Thirdly, in the case where the count mode has been selected, the count mode selecting switch $PB_{342}$ of the stop condition circuit 90 is open, and therefore the winker circuit and the automatic stop solenoid driving circuit are not operated. When all of the sheets have been counted, no sheet abuts the suction head, that is, the suction head 38 is opened to the atmosphere. Accordingly, the operations of the vacuum pump VPM and the rotor driving motor $M_2$ are suspended. On the other hand, when the relay $RL_4$ is deergized, the contact means $RL_{51}$ in the start circuit 60 is closed to connect the output line $d_1$ to the power line $l_1$, as a result of which the holder motor $M_1$ is driven. Thus, the sheet counting operation is completed with the holder 17 kept at the open position.

As is apparent from the above description, according to the invention, in the automatic stop mode the sheet counting operation is automatically suspended with the holder 17 closed when the number of sheets counted coincides with a number of sheets set; and in the alarm mode the winker circuit 54 is operated while the holder 17 is maintained closed when the number of sheets counted does not coincide with a number of sheets set upon completion of the sheet counting operation; and in the count mode all of the sheets are counted without operation of the alarm. Thus, the sheet counting machine according to this invention can positively carry out the sheet counting operation in all of the sheet counting modes.

Furthermore, in the automatic stop mode and also in the alarm mode, the count confirmation output $a$ used in common for both of the modes is obtained on the basis of the output of the sheet number setting device operated to set a number of sheets to be counted and the output of the counter. As a result, the sheet counting machine according to the invention is simple in construction and able to positively carry out the sheet separating operation and the count confirming operation with respect to a number of sheets set as desired.

What is claimed is:

1. In a sheet counting machine having a counting means for counting a number of sheets being separated one by one from a stack of sheets held in a sheet holder; a number setting means for setting in advance a number of sheets desired to be counted; a coincidence detecting means to which said counting means and said number setting means are coupled for producing, when a count value obtained by said counting means coincides with the numerical value set in said number setting means, a coincidence detection signal; a completion detecting means for detecting, when the operation of counting all of the sheets in a stack held by said holder has been completed, the completion of said counting operation and producing a completion detection signal; and a control means to which said coincidence detecting means and said completion detecting means are coupled for controlling a sheet counting operation in cooperation with said counting means, said control means:

a. automatic stop mode means for controlling the machine in an automatic stop mode and responsive to the coincidence detection signal produced by said coincidence detecting means for stopping the sheet counting operation of said machine when the count value obtained by said counting means coincides with the numerical value set in said number setting means;

b. alarm mode means for controlling the machine in an alarm mode and including alarm means and means responsive to the coincidence detection signal produced by said coincidence detecting means for inhibiting the stopping of a sheet counting operation through said control means and responsive to the completion detection signal produced by said completion detection means for stopping the sheet counting operation when an operation of counting all of the sheets in a stack held in said holder is completed, and if during this operation no coincidence detection signal is produced by said coincidence detecting means operating said alarm means; and c. count mode designating means for controlling the machine in a count mode and including means for inhibiting the sheet counting operations effected by operation of said automatic stop mode means and said alarm mode means, and means responsive to the completion detection signal produced by said completion detecting means for stopping, when the counting of all of the sheets in a stack held in said holder is completed, the sheet counting operation, whereby sheets in a stack held in said holder are counted in a desired mode selected from among said automatic stop mode, alarm mode, and count mode by selective operation of said automatic stop mode means, alarm mode means and count mode designating means.

* * * * *

UNITED STATES PATENT AND TRADEMARK OFFICE
CERTIFICATE OF CORRECTION

PATENT NO. : 3,983,367
DATED : September 28, 1976
INVENTOR(S) : TAKASHI KONDO et al.

It is certified that error appears in the above–identified patent and that said Letters Patent are hereby corrected as shown below:

Title page, left-hand column add:

[30] Foreign application priority data

February 14, 1974   Japan   49-17126

Signed and Sealed this

Twenty-eighth Day of December 1976

[SEAL]

Attest:

RUTH C. MASON
*Attesting Officer*

C. MARSHALL DANN
*Commissioner of Patents and Trademarks*